United States Patent
Riekels et al.

(10) Patent No.: US 7,447,096 B2
(45) Date of Patent: Nov. 4, 2008

(54) METHOD FOR REFRESHING A NON-VOLATILE MEMORY

(75) Inventors: James E. Riekels, New Hope, MN (US); Samuel Schlesinger, Aventura, FL (US)

(73) Assignee: Honeywell International Inc., Morristown, NJ (US)

( * ) Notice: Subject to any disclaimer, the term of this patent is extended or adjusted under 35 U.S.C. 154(b) by 115 days.

(21) Appl. No.: 11/619,677

(22) Filed: Jan. 4, 2007

(65) Prior Publication Data

US 2007/0258306 A1 Nov. 8, 2007

Related U.S. Application Data

(60) Provisional application No. 60/798,224, filed on May 5, 2006.

(51) Int. Cl.
*G11C 7/00* (2006.01)
(52) U.S. Cl. .............. 365/222; 365/185.12; 365/185.25
(58) Field of Classification Search .............. 365/222, 365/238.5, 185.12, 185.09, 185.25, 227
See application file for complete search history.

(56) References Cited

U.S. PATENT DOCUMENTS

| | | | |
|---|---|---|---|
| 4,956,795 A | 9/1990 | Yamaguchi et al. | 364/571.03 |
| 5,197,026 A | 3/1993 | Butler | 365/104 |
| 5,239,505 A | 8/1993 | Fazio et al. | 365/185 |
| 5,347,486 A | 9/1994 | Urai | 365/185 |
| 5,365,486 A | 11/1994 | Schreck | 365/222 |
| 5,381,379 A | 1/1995 | Fakumoto | 365/238.5 |
| 5,446,695 A | 8/1995 | Douse et al. | 365/222 |
| 5,475,693 A | 12/1995 | Christopherson et al. | 371/102 |
| 5,511,020 A | 4/1996 | Hu et al. | 365/185.28 |
| 5,528,535 A | 6/1996 | Honjo et al. | 365/145 |
| 5,606,532 A | 2/1997 | Lambrache et al. | 365/238.5 |
| 5,619,470 A | 4/1997 | Fakumoto | 365/228 |
| 5,625,791 A | 4/1997 | Farrugia et al. | 395/433 |
| 5,703,823 A | 12/1997 | Douse et al. | 365/222 |
| 5,765,185 A | 6/1998 | Lambrache et al. | 711/103 |

(Continued)

FOREIGN PATENT DOCUMENTS

| | | |
|---|---|---|
| EP | 1 253 599 A1 | 10/2002 |
| WO | WO 02/069344 A2 | 9/2002 |

OTHER PUBLICATIONS

International Search Report for PCT/US2007/003198 dated Feb. 21, 2008.

*Primary Examiner*—Richard Elms
*Assistant Examiner*—Hien N Nguyen
(74) *Attorney, Agent, or Firm*—McDonnell Boehnen Hulbert & Berghoff LLP

(57) ABSTRACT

A non-volatile memory and a method of refreshing a memory are described. The method includes allowing an external system to control refreshing operations within the memory. The memory may generate a refresh request signal and transmit the refresh request signal to the external system. When the external system finds an available time to process the refresh request, the external system acknowledges the refresh request and transmits a refresh acknowledge signal to the memory. The memory may also comprise a page register for reading and rewriting a data state back to the memory. The page register may comprise latches in lieu of supplemental non-volatile storage elements, thereby conserving real estate within the memory.

20 Claims, 5 Drawing Sheets

(A)  (B)

U.S. PATENT DOCUMENTS

| | | | |
|---|---|---|---|
| 5,768,193 A | 6/1998 | Lee et al. | 365/185.25 |
| 5,818,762 A | 10/1998 | Maari et al. | 365/185.25 |
| 5,847,577 A | 12/1998 | Trimberger | 326/38 |
| 5,847,991 A | 12/1998 | Tong et al. | 365/185.03 |
| 5,852,582 A | 12/1998 | Cleveland et al. | 365/222 |
| 5,889,698 A | 3/1999 | Miwa et al. | 365/185.03 |
| 5,896,318 A | 4/1999 | Asada et al. | 365/185.24 |
| 5,943,254 A | 8/1999 | Bakeman, Jr. et al. | 365/72 |
| 5,950,224 A | 9/1999 | Devin | 711/106 |
| 5,969,993 A | 10/1999 | Takeshima | 365/185.29 |
| 6,026,018 A | 2/2000 | Herdt et al. | 365/185.07 |
| 6,031,263 A | 2/2000 | Forbes et al. | 257/315 |
| 6,049,497 A | 4/2000 | Yero | 365/222 |
| 6,151,246 A | 11/2000 | So et al. | 365/185.09 |
| 6,160,738 A | 12/2000 | Atsumi et al. | 365/185.25 |
| 6,188,610 B1 | 2/2001 | Kakizoe et al. | 365/185.22 |
| 6,240,032 B1 | 5/2001 | Fukumoto | 365/222 |
| 6,249,020 B1 | 6/2001 | Forbes et al. | 257/315 |
| 6,307,775 B1 | 10/2001 | Forbes et al. | 365/185.01 |
| 6,307,776 B1 | 10/2001 | So et al. | 365/185.03 |
| 6,336,161 B1 | 1/2002 | Watts | 711/103 |
| 6,349,058 B1 | 2/2002 | Thomsen | 365/185.08 |
| 6,385,688 B1 | 5/2002 | Mills et al. | 711/103 |
| 6,404,688 B2 | 6/2002 | Okuyama et al. | 365/222 |
| 6,542,996 B1 | 4/2003 | Chang et al. | 713/300 |
| 6,564,285 B1 | 5/2003 | Mills et al. | 711/103 |
| 6,633,500 B1 | 10/2003 | Chou et al. | 365/185.25 |
| 6,636,440 B2 | 10/2003 | Maayan et al. | 365/185.25 |
| 6,639,839 B1 | 10/2003 | Chou et al. | 365/185.25 |
| 6,668,303 B2 | 12/2003 | Pio | 711/103 |
| 6,711,082 B1 | 3/2004 | Loffler | 365/222 |
| 6,731,557 B2 | 5/2004 | Beretta | 365/222 |
| 6,751,127 B1 | 6/2004 | Chou et al. | 365/185.25 |
| 6,754,125 B2 | 6/2004 | Fournel et al. | 365/222 |
| 6,772,992 B1 | 8/2004 | Lombardo et al. | 251/315 |
| 6,781,876 B2 | 8/2004 | Forbes et al. | 365/185.01 |
| 6,856,568 B1 | 2/2005 | Wong | 365/222 |
| 6,898,117 B2 | 5/2005 | So et al. | 365/185.03 |
| 6,961,281 B2 | 11/2005 | Wong et al. | 365/230.03 |
| 2001/0032997 A1 | 10/2001 | Forbes et al. | 257/315 |
| 2002/0116592 A1 | 8/2002 | Pio | 711/200 |
| 2002/0126536 A1 | 9/2002 | Forbes et al. | 365/185.28 |
| 2002/0159308 A1 | 10/2002 | Fournel et al. | 365/200 |
| 2002/0191465 A1 | 12/2002 | Maayan et al. | 365/222 |
| 2003/0021149 A1 | 1/2003 | So et al. | 365/185.03 |
| 2003/0169245 A1 | 9/2003 | Tamura | 345/204 |
| 2003/0189539 A1 | 10/2003 | Tamura | 345/89 |
| 2003/0200382 A1 | 10/2003 | Wells et al. | 711/106 |
| 2003/0227801 A1 | 12/2003 | Battaglia | 365/200 |
| 2004/0034732 A1 | 2/2004 | Valin et al. | 711/4 |
| 2004/0151031 A1 | 8/2004 | Tanaka | 365/185.29 |
| 2004/0190210 A1 | 9/2004 | Leete | 361/90 |
| 2004/0213035 A1 | 10/2004 | Caveleri et al. | 365/154 |
| 2004/0237010 A1 | 11/2004 | Auclair et al. | 714/721 |
| 2004/0251486 A1 | 12/2004 | Van Brocklin et al. | 257/314 |
| 2005/0058001 A1 | 3/2005 | Wong et al. | 365/230.03 |
| 2005/0073501 A1 | 4/2005 | Chen | 345/163 |
| 2005/0102584 A1 | 5/2005 | Paturi et al. | 714/47 |
| 2005/0135155 A1 | 6/2005 | Ishimaru et al. | 365/185.25 |
| 2005/0174844 A1 | 8/2005 | So et al. | 365/185.03 |
| 2005/0195975 A1 | 9/2005 | Kawakita | 380/30 |
| 2005/0237799 A1 | 10/2005 | Fukuoka | 365/185.3 |
| 2005/0243626 A1 | 11/2005 | Ronen | 365/222 |
| 2005/0249010 A1 | 11/2005 | Klein | 365/222 |

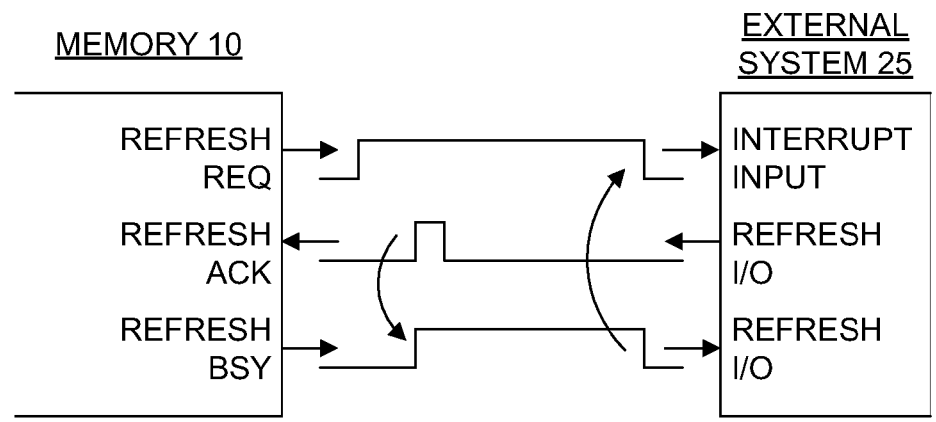
(A)
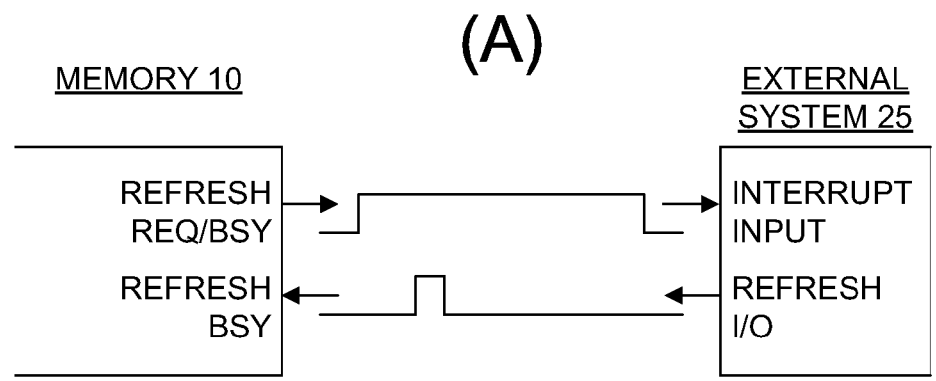
(B)
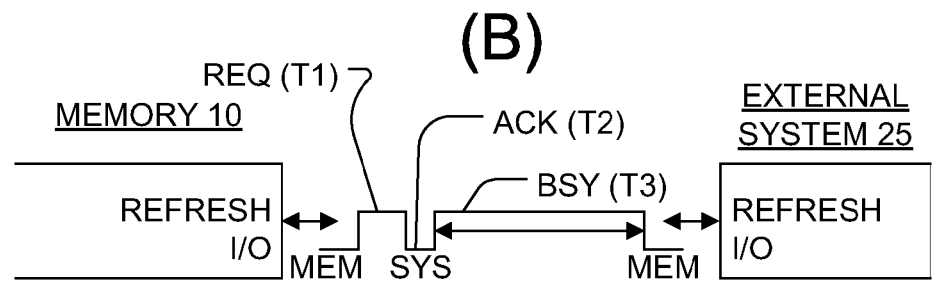
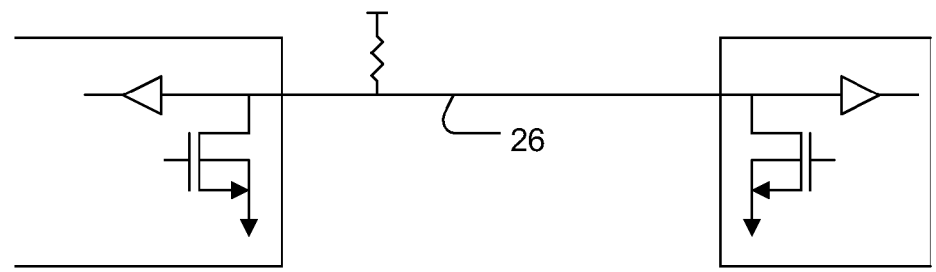
(C)
Fig. 3

Fig. 4 (A) (B)

METHOD FOR REFRESHING A NON-VOLATILE MEMORY

CROSS-REFERENCE TO RELATED APPLICATIONS

The present application claims priority to U.S. Provisional Application No. 60/798,224, entitled "EEPROM Data Refresh Dedicated Interface," filed May 5, 2006, which is hereby incorporated by reference herein in its entirety.

GOVERNMENT RIGHTS

The United States Government may have acquired certain rights in this invention pursuant to Contract No. DE-FC26-03NT41834 awarded by the Department of Energy.

FIELD

The invention relates to the field of non-volatile memories, and more particularly to non-volatile memories that need to be periodically refreshed.

BACKGROUND

Although generally regarded as non-volatile, electrically erasable programmable read only memories (EEPROMs) need to be refreshed. The need to refresh occurs when charge stored on the floating gate of an EEPROM cell decays. This decay is a function of time, temperature, and can also be "disturbed" through normal use of the memory, including both write and read operations. Thus, there are use scenarios in which the charge within an EEPROM cell, and therefore the data the charge represents, cannot be retained indefinitely.

Furthermore, the definiteness of charge storage within an EERPROM cell is reduced at elevated temperatures. As temperature is increased, charge stored on the floating gate decays more rapidly than at lower temperatures. At 250° C., for example, industry papers have suggested that data retention in an EEPROM cell may not last any longer than 1000 to 3000 hours.

To retain charge, EEPROMs can include circuitry that allows the data state of the EEPROM to be refreshed. Current EEPROMs autonomously determine when to be refreshed. For example, an EEPROM may include a detector that determines when the average threshold voltage has shifted. When this detector finds that the threshold voltage has shifted, the EEPROM may refresh each memory cell within the memory. Unfortunately, the EEPROM either blocks external system access to the memory when the EEPROM is refreshing or must suspend the refresh until the external system is finished accessing the EEPROM.

Thus, as temperature increases, an EEPROM may need to refresh itself more frequently. However, when an EEPROM is refreshed, the refresh operation may disrupt an external system that uses the EEPROM. Consequently, at elevated temperatures refresh operations may disrupt an external system's access to the EEPROM. Therefore, there is a need for an EEPROM that does not disrupt external system access.

Also, because an EEPROM autonomously determine when it will refresh itself, EEPROMs requires control logic to coordinate blocking the external system access and refreshing themselves. This control logic necessitates the use of additional memory, taking up valuable real estate within an EEPROM. Thus, it is also desirable to design EEPROMs so that their operational components do not require excessive layout space.

SUMMARY

A method for refreshing a non-volatile memory is presented. The non-volatile memory accommodates refreshing and mitigates memory size by allowing an external system to control refreshing operations within the memory. The method includes transmitting a refresh request signal to the external system and receiving a refresh acknowledge signal from the external system and responsively refreshing the memory.

To transmit the refresh request signal and receive the refresh acknowledge signal, the memory may include a refresh state machine. The state machine may be triggered to transmit the refresh request signal by a power-on reset detector, a refresh counter, or a threshold drift detector, for example.

To refresh the memory, the method may include using a page register to read a data state from the memory and re-write the data state back to the memory. To do this without using supplemental nonvolatile memory, the page register, for example, may include a plurality of latches.

In another example, a method for refreshing a memory includes, a controller receiving a refresh acknowledge signal from an external system, and responsive to receiving the refresh acknowledge signal, the controller directing a page register to read a data state associated with the memory page and rewrite the data state back to the memory. To do this, the page register may comprise a plurality of latches that, in operation, temporarily store the data state and write the temporarily stored data state back to the memory page.

Because the external system controls refresh operations within the memory, a method may also include the controller transmitting a refresh request signal to the external system and awaiting the refresh acknowledge signal. To do this, the controller may comprise a refresh state machine for coordinating the refresh request and the refresh acknowledge signals. The refresh request signal, for example, may be triggered by at least one of a threshold drift detector, a power-on reset detector, and a refresh counter. In addition, the refresh state machine may also transmit a refresh busy signal to the external system when the page register reads and rewrites the data state.

In an alternative example, a refreshable non-volatile memory is presented. The memory includes at least one memory page that includes a plurality of non-volatile memory cells, a decoder for selecting a memory page from the memory that is to be refreshed, a page register that includes a plurality of latches for coupling to a selected memory page, and a controller coupled to the page register and configured to receive a refresh acknowledge signal from an external system. The controller, in operation and upon receiving the refresh acknowledge signal, directs the page register to read a data state associated with the selected memory page and rewrite the data state back to the selected memory page.

These as well as other aspects and advantages will become apparent to those of ordinary skill in the art by reading the following detailed description, with reference where appropriate to the accompanying drawings. Further, it is understood that this summary is merely an example and is not intended to limit the scope of the invention as claimed.

BRIEF DESCRIPTION OF THE DRAWINGS

Certain examples are described below in conjunction with the appended drawing figures, wherein like reference numerals refer to like elements in the various figures, and wherein:

FIGS. 3A-C are block diagrams illustrating various types of communication between a memory and an external system, according to an example;

DETAILED DESCRIPTION

A. Memory and Refresh Overview

A non-volatile memory and a method for refreshing a non-volatile memory are described. An external system may use the memory to store various forms of programs, data, processing instructions, etc. However, in contrast to conventional memories, which internally coordinate refresh signals, the interface allows the external system to coordinate refreshing. Thus, the external system is in control of the memory, enabling the system to operate more efficiently. For example, during a refresh, a memory would have previously had to look for moments when the external system is not accessing the memory and attempt to refresh In particular, the memory may be a non-volatile memory such as EEPROM, MRAM, or flash. Such memories are generally described as non-volatile, as these memories store data states for intervals that are quantifiable in terms of days, months, or years. Volatile memories, on the other hand, such as dynamic random access memories (DRAM), need to be refreshed in intervals that may be as short as several minutes or seconds. In extreme environments, e.g., high temperature environments, the data retention time of non-volatile memories may reduced by an order of magnitude or more. In these circumstances the data retention time of non-volatile memory is still significantly higher than that of volatile memory; however, the refresh frequency is increased. Thus, the described interface and method may be particularly well suited to circumstances where a memory needs to be refreshed more frequently, but the memory is still inherently non-volatile.

Generally speaking, the first step in implementing a data refresh feature in accordance with the invention is to determine when the data should be refreshed before there is an opportunity for charge in the memory cells to decay to a point where the data is no longer properly stored. Some scenarios that may trigger a refresh operation are that a predetermined amount of time has expired, power has been applied to the memory, a specified number of operations has occurred (e.g., program, erase, read), and/or after a detectable drift in threshold voltage has been measured in a memory cell.

Figure 1:
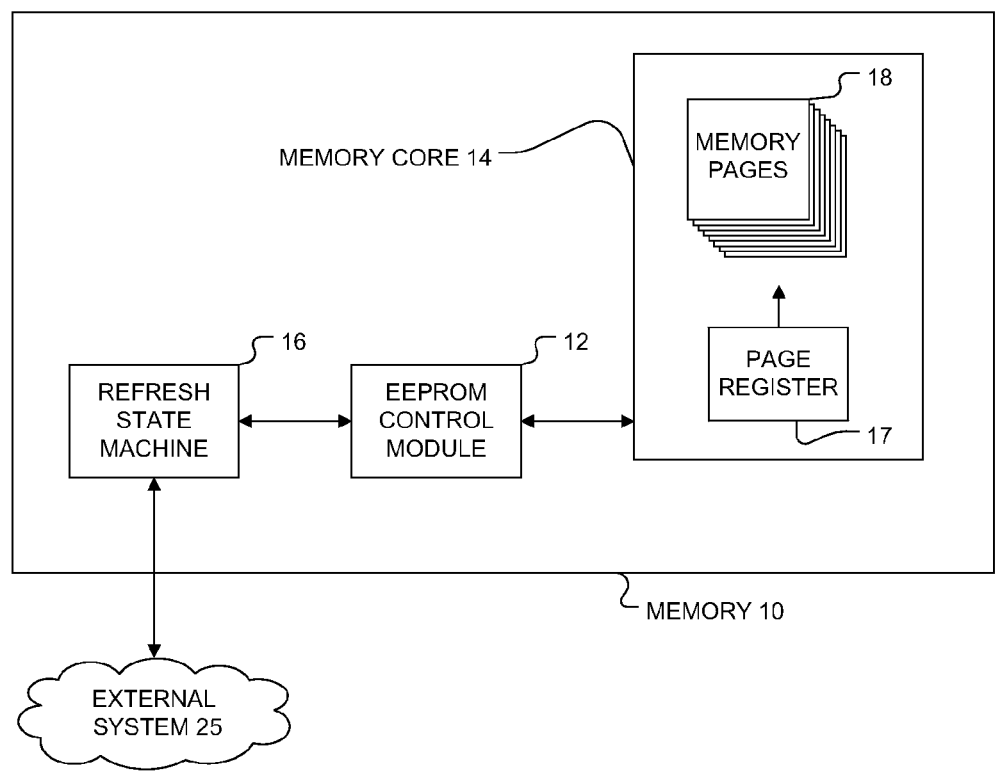
FIG. 1 is a block diagram of a refreshable memory coupled to an external system, according to an example.

FIG. 1 shows a block diagram of an example EEPROM memory 10 that includes a control module 12, a memory core 14, and a refresh state machine 16. The memory core 14 comprises a page register 17 and memory pages 18. The control module 12, in operation, coordinates reading and writing and operations within the memory core 14. In lieu of additional memory cells, the memory core 14 includes a page register 17 for temporarily storing a memory page. Such temporary storage allows the memory pages 18 to be refreshed without adding supplemental memory cells to the memory core 14.

The memory 10 may receive write or read instructions from an external system 25. The refresh state machine controls access to the memory 10. For example, when the memory 10 is being refreshed, the refresh state machine 16 may prevent the system 25 from accessing the memory core 14. In addition to control access to the memory 10, the refresh state machine 16 also coordinates refreshing operations within the memory 10.

Figure 2:
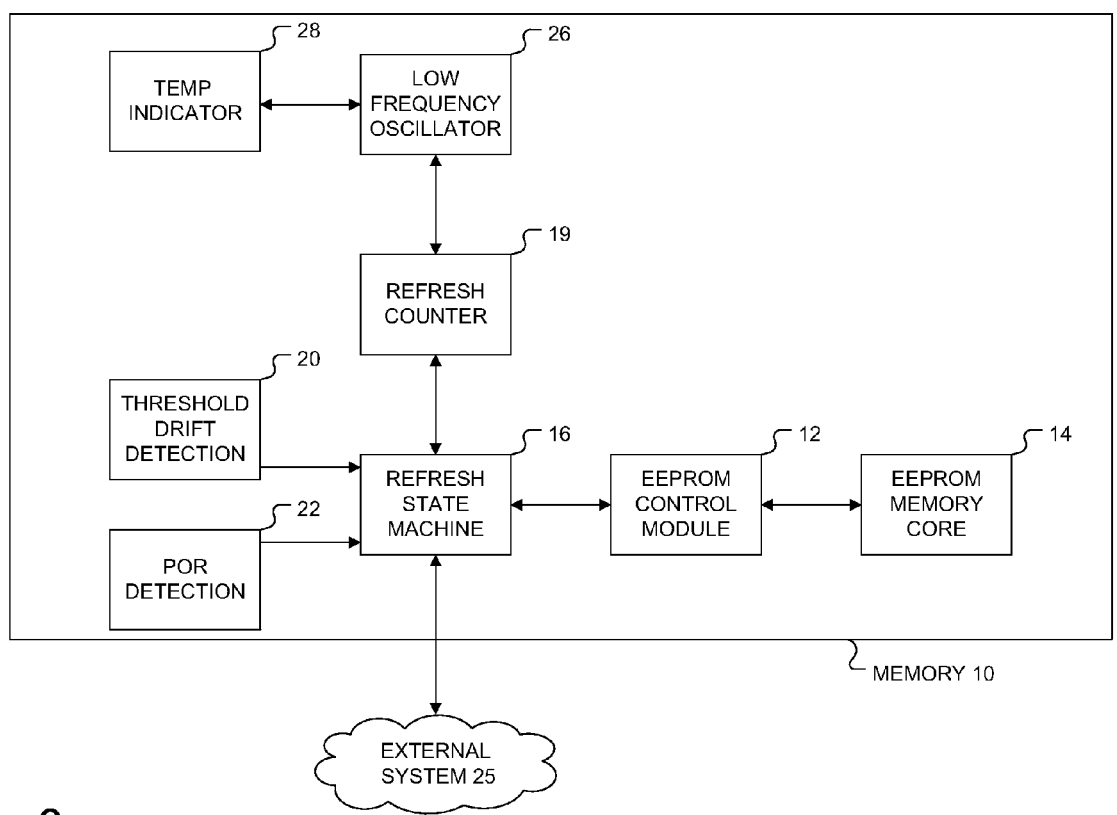
FIG. 2 is a block diagram of the memory of FIG. 1 having modules for triggering a refresh request from a refresh state machine, according to an example.

FIG. 2 shows the memory 10 further including a refresh counter 19, a threshold shift detector 20, and a power-on reset (POR) detector 22. The refresh state machine 16, is responsible for transmitting refresh request (Refresh REQ) signals to the external system 25. The refresh counter 19, the threshold shift detector 20, and the POR detector 22 may each trigger the refresh state machine 16 to send Refresh REQ signals. It should be understood that the refresh state machine 16 may be viewed as a separate component, as is shown in FIG. 2. Alternatively, the refresh state machine 16 may be incorporated into the control module 32 (see FIG. 4A).

The refresh counter 19, which is shown as coupled to an oscillator 26 and a temperature indicator 28, indicates that the memory 10 should be refreshed after a predetermined count value. The count value is increased each time the oscillator cycles. The temperature indicator 28 may speed up or slow down the oscillator, influencing the time at which the refresh counter 19 will reach the count value. Thus, once the refresh counter 19 reaches the predetermined count value, the refresh state machine 16 may trigger the Refresh REQ signal.

The threshold shift detector 20 measures a change in threshold voltage and accordingly the refresh state machine 16 generates a Refresh REQ signal when threshold voltage deviates past one or more predetermined threshold voltage values. Typically, electrons are added to, or removed from, a memory cell floating gate to positively, or negatively, shift its threshold voltage. The shift applied during a program or erase of the memory cell is large enough to ensure it can be reliably detected when compared to a fixed level. Additional memory cells may be provided in or around the memory core 14 for the purpose of gauging threshold shift. These cells are programmed and erased like those in the array. Because these cells are not part of the actual memory core 14, they can be accessed at any time, and these cells' threshold voltages are measured independent of operations with the memory core 14.

The POR detector 22 may determine when power has been first applied to the memory 10, and the refresh state machine 16 may accordingly generate a Refresh REQ signal. The POR detector 22 may also be configured so that the refresh state machine 16 generates a Refresh REQ signal when the memory 10 experiences a power glitch, for example. In general, the POR detector 22 monitors when the supply voltage of a component rises from a level that is too low for circuits within the component to operate predictably, to a higher level in which circuits within the component operate predictably. Upon sensing this low to high transition, the power-on reset circuit generates a RESET pulse so that as the circuitry is placed into a known, predictable state, as the circuitry transitions from being unpredictable to predictable with the supply voltage.

B. Memory and System Interface

FIGS. 3A-C are block diagrams that illustrate various types of interactions between the memory 10 and the external system 25. FIG. 3A shows signal handshaking between the system 25 and the memory 10. In FIG. 3A, the signal handshaking begins when the memory 10 issues or transmits a Refresh REQ signal to the external system 25. For example, the POR detector 22 may indicate that the memory core 14 should be refreshed. When the external system 25 identifies a window of time during which the system can operate without read or write access to the memory 10, the external system 25 directs the memory 10 to refresh by delivering an appropriate response as a refresh acknowledge (Refresh ACK) signal. Upon receiving the directive to refresh, the memory 10 begins refreshing. For the duration that the memory 10 is actually performing the refresh, the memory may output a refresh busy (Refresh BSY) signal. The Refresh BSY signal may, for example, serve as an indicator to other devices that the memory 10 is busy. During the time that memory 10 is refreshing, all read and write requests are ignored. Upon completing the refresh, the memory 10 disables the Refresh BSY signal.

In FIG. 3B, the Refresh REQ and Refresh BSY signals are combined into one. A Refresh REQ is sent to the external system 25. When the external system 25 identifies a window of time during which the external system 25 can operate without read or write access to the memory 10, it directs the memory 10 to refresh with an appropriate response on the Refresh ACK signal, and the memory 10 begins refreshing. For the duration that the memory 10 is actually performing the refresh, the memory 10 outputs the Refresh BSY signal. The memory 10 ignores all read and write requests during this time. Upon completing the refresh, the memory 10 disables the Refresh BSY signal.

The arrangement shown in FIG. 3C, allows the memory 10 and the external system 25 to communicate through a single signal. Connections to both the memory 10 and the external system 25 are bidirectional (input and output), with the outputs being open-drain. A pull-up resistor is added externally or inside one of the components. Operation is as follows: in a default state, I/O of the external system 25 is configured as an input. The memory 10's I/O is configured as an output, which is configured to remain at a low voltage until a Refresh REQ is to be issued. The Refresh REQ signal is a high voltage, the Refresh ACK is a low voltage, and the Refresh BSY signal is a high voltage, all transmitted on a single wire 26.

In the example of FIG. 3C, to request a refresh, the memory 10 pulses to a high voltage, T1, such that, for example, the memory 10 I/O stops pulling the wire 26 to a low voltage and a pull-up resistor pulls the signal on the wire 26 high. A high voltage signal notifies the external system 25 that the memory 10 is requesting a refresh operation. Upon releasing the wire 26, the memory 10 I/O changes from being an output to an input, preparing to receive input from the external system 25. When the external system 25 identifies a window of time during which it can operate without read or write access to the memory 10, the system directs the memory 10 to refresh by pulling the voltage on the wire 26 to a low voltage, T2, for a duration long enough to be sensed by the memory 10 (such timing may only be gate delays or set by a clock frequency in the memory 10). After pulling the wire 26 to a low voltage, the external system 25's IO returns to being an input, and the signal line returns to a high voltage by a pull-up resistor, for example. In response to the Refresh ACK signal transmitted from the external system 25, the memory 10 refreshes. The memory 10 ignores all read and write requests during this time. Upon completing the refresh, the memory 10 returns to being an output and pulls the wire 26 to a low voltage to indicate to the external system 25 that the refresh is complete.

It should be noted that a memory may be pre-configured to operate with an external system in such a manner, where the external system is in direct control of the refreshing operations that are to be carried out within the memory. For example, the memory may provide input and output terminals that correspond with the example shown in FIGS. 3A-C. It should also be understood that the memory 10 may include a variety of different types of memory architectures. Described below is one type of memory architecture that may be refreshed by an external system.

C. Memory Controller and Memory Core

Figure 4:
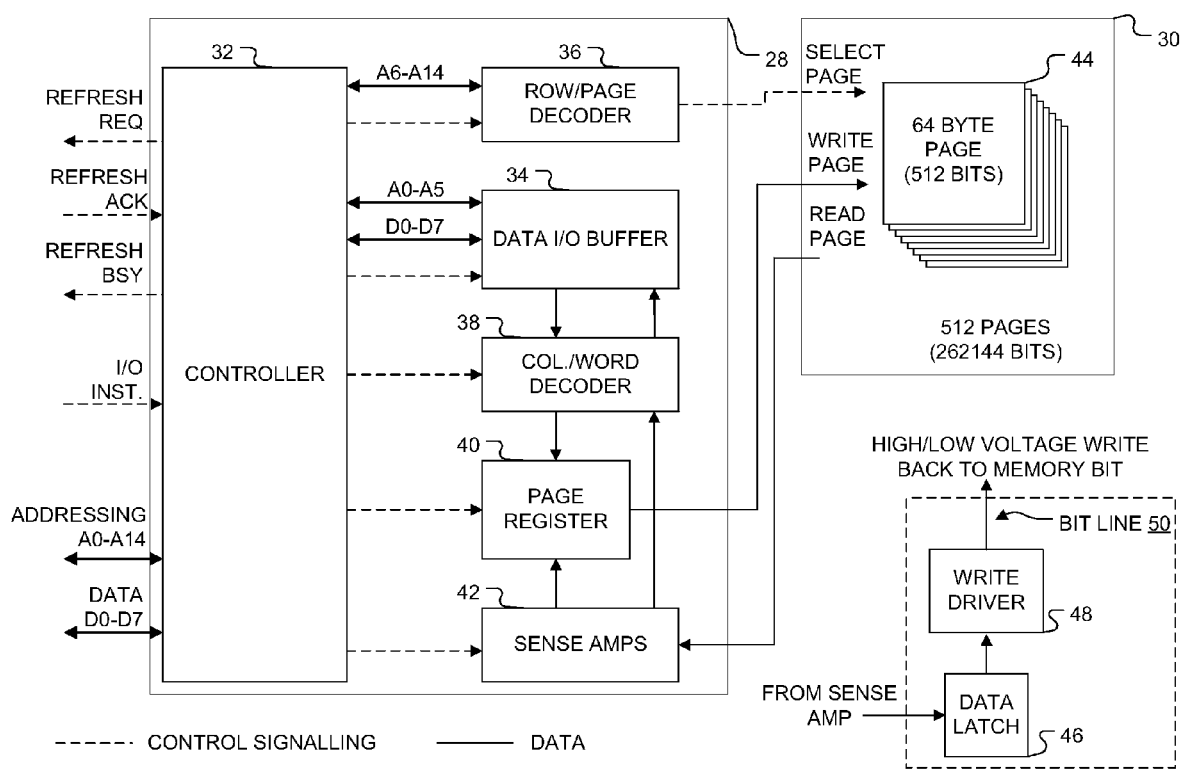
FIG. 4A is a block diagram illustrating an example memory page architecture.
FIG. 4B is a block diagram illustrating data latch, which may be employed by a page register, according to an example.

FIG. 4A is a block diagram that illustrates an example control module 28 and memory core 30. The control module includes a controller 32, data I/O buffer 34, a row/page decoder 36, a column/word decoder 38, a page register 40, and sense amplifiers 42. The memory core 30 includes memory pages 44. In the example of FIG. 4A, the memory core 30 includes 512 memory pages. Each of the memory pages 44 comprises arrays of individual memory cells, where each individual array represents a memory word. In this example, the memory pages 44 have 64 memory words each, where each memory word is 8 bits in size. Thus, each of the memory pages 44 holds 512 bits, making the memory core 30 a 32 KB memory. It should be understood, however, that more or fewer memory words or pages may be included within a particular memory core and a memory page may include a variety of types of memory cells, examples of which include EEPROM, MRAM, and flash.

The control module 28 coordinates the reading and writing of the memory core 30 and refreshes the memory core 30 upon receiving a Refresh ACK signal. The controller 32, for example, may include a refresh state machine (not shown), which also coordinates the transmission and reception of the Refresh REQ and Refresh ACK signals.

When reading and writing, the memory receives addressing information A0-A14, data D0-D7, as well as operational instructions. The first 6 bits of the addressing information, A0-A5, correspond to which word on a page is to be written or read. The remaining 9 bits of the addressing information correspond to the particular page that is to be written or read. For example, an address of "110010111011001" would address a word location of "011001" (25) on the "110010111" (407th) page.

To read the memory core 30, the controller 32 selects a memory page from the memory core 30 using an input address along with the page decoder 36. The sense amps 42 read the selected memory page. The word decoder 38 uses the input address when selecting a memory word location within the selected memory page. The memory word is communicated to the buffer 34 and then output at the controller 32.

To write the memory core 30, the controller 32 places a word at a memory location that is based on a destination address. The controller 32 loads the word into the buffer 34 at the word location specified in the address. The row decoder 36 uses the address to select a page from the memory core 30. The sense amps 42 read the selected page into the page register 40. The column decoder 38 places the word into word address location within the page register 40, using the destination address and the loaded word. The page register 40 then writes the entire page back into the memory core 30.

To refresh the entire memory core 30, the controller 32 directs the page register 40 to re-write each page within the memory core 30. Because the page register 40 does not need to include memory cells to temporarily hold a data state, real estate within the memory may be conserved, thus reducing the overall size of a memory.

In general, the page register 40 includes a plurality of latches for reading and writing (or re-writing) a data state back to a memory page. FIG. 4B shows a data latch 46, which may be included in a page register and may be used to write a bit within a selected memory page. The data latch 46 may be one of a variety of data latches, examples of which include D or J/K flip flops. In operation, the data latch 46 holds a data value when triggered to do so by a clock signal (not shown). The clock signal, for example, may be a rising or falling edge of a clock pulse.

After being triggered by a clock pulse, the data latch 46 reads and holds the data value for one or more clock cycles and supplies this data value to the write driver 48. The data latch 46 may then by triggered again, and a new data value may be loaded into the data latch 46 and supplied to the write driver 48. The write driver 48 provides a data value output to bit line 50, which in turn may be used to write (or rewrite) a bit within a selected memory page. Thus, a page register, comprising a plurality of latches, may be coupled to a selected set of bits, words, or a memory page within a memory. Accordingly, a data state may comprise data values that included a selected set of bits, words, or a memory page within a memory.

Figure 5:
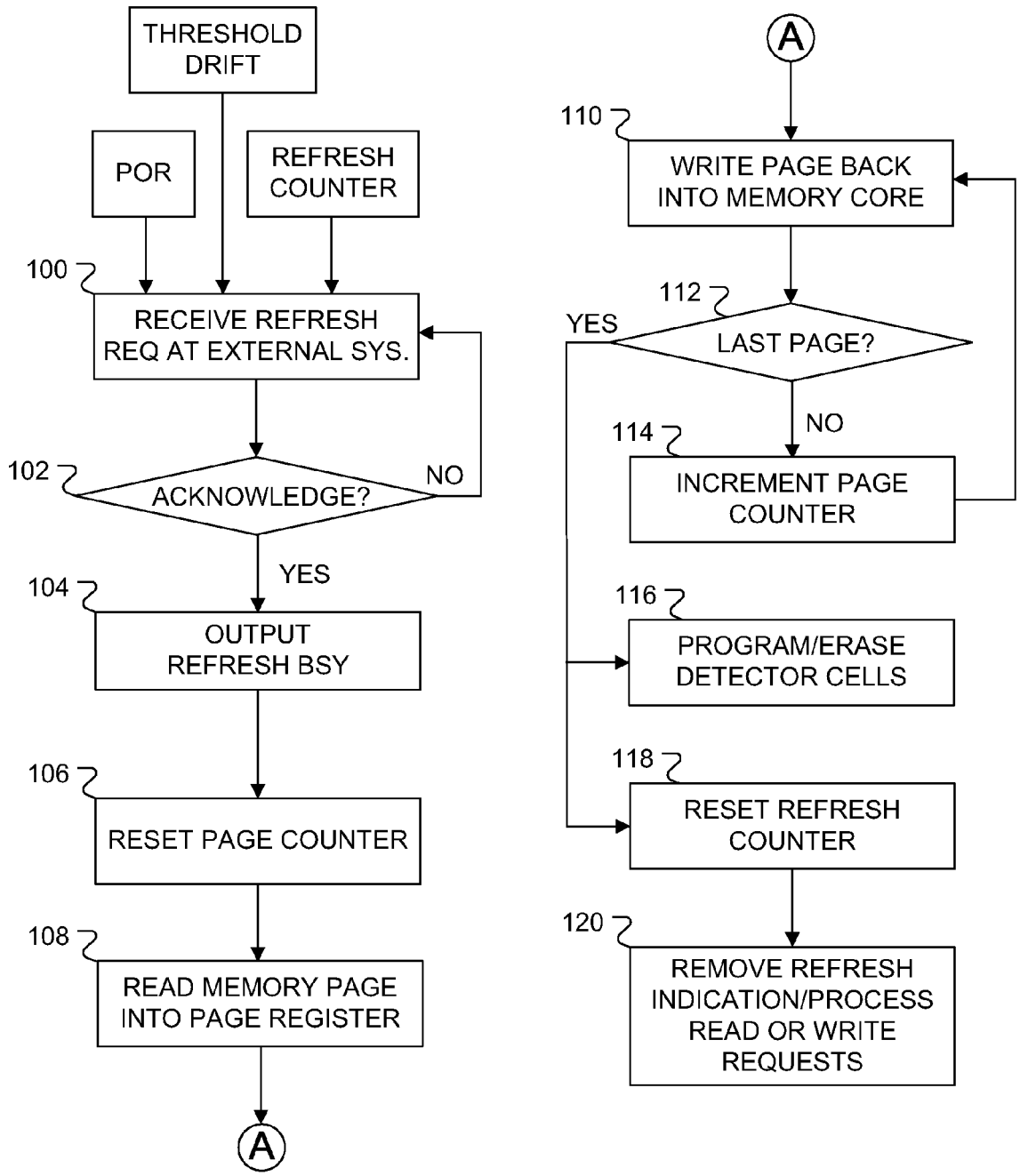
FIG. 5 is a flow diagram of a method of refreshing the memory controller and memory core of FIG. 4A, according to an example.

FIG. 5 shows a method for refreshing a memory controller and a memory core, such as, for example, the memory controller 28 and the memory core 30. At block 100, an external system receives a Refresh Req. The Refresh REQ signal, for example, may be triggered by a POR detector, a threshold drift detector, a refresh counter, or from a memory controller. At block 102, the external system decides whether to refresh the memory core. If the external system acknowledges the request (i.e., via a Refresh ACK signal), the memory controller may output a Refresh BSY signal and/or ignore read or write requests, shown at block 104.

At block 106, the memory controller resets a page counter. The address of the memory page is then be loaded into the page register, shown at block 108. At block 110, the loaded page is rewritten into the memory core. Each page in the memory core is rewritten until a page counter indicates that the last page in the memory core has been written, shown at blocks 112 and 114. The page counter, for example, may be located within a refresh state machine/controller, and it may be used to refresh an entire memory core. To do this, the page counter may, in an iterative fashion, select and then refresh each memory page within a memory core.

At blocks 116 and 118, a new threshold voltage may be programmed into a threshold detector and a refresh counter may be reset (the threshold detector and the refresh counter could also be reset at block 104). At block 120, the memory controller de-activates the Refresh BSY signal and/or may acknowledge read and write requests.

D. Conclusion

The above description provides a variety of example methods that allows an external system to control refreshing operations. An example memory architecture has also been described. Those skilled in the art will understand that changes and modifications may be made to these examples without departing from the true scope and spirit of the present invention, which is defined by the claims. Thus, for example, although an example memory that includes memory pages has been described, other types of memories may be employed. In addition, the Refresh REQ signal, although described as being triggered by a POR, threshold drift detector, or a refresh counter, may also be triggered by other components within the memory. Also, although being described above as responsive to a Refresh REQ signal, the Refresh ACK signal may be transmitted from an external system without being prompted by a Refresh REQ signal.

Accordingly, the description of the present invention is to be construed as illustrative only and is for the purpose of teaching those skilled in the art the best mode of carrying out the invention. The details may be varied substantially without departing from the spirit of the invention, and the exclusive use of all modifications which are within the scope of the appended claims is reserved.

We claim:

1. A method for refreshing a non-volatile memory, wherein the method comprises:
   providing a non-volatile memory that allows an external system to control refreshing operations within the memory.
   transmitting a refresh request signal to the external system; and
   receiving a refresh acknowledge signal from the external system and responsively refreshing the memory.

2. The method as in claim 1, wherein the memory comprises a refresh state machine for transmitting the refresh request signal and receiving the refresh acknowledge signal.

3. The method as in claim 2, wherein the memory comprises at least one of a power-on reset detector, a refresh counter, and a threshold drift detector for triggering the state machine to transmit the refresh request signal.

4. The method as in claim 1, wherein refreshing the memory comprises using a page register to read a data state from the memory and re-write the data state back to the memory.

5. The method as in claim 4, wherein the page register comprises a plurality of latches.

6. A method for refreshing a non-volatile memory, the method comprising:
   providing a non-volatile memory that comprises a controller, at least one memory page, and a page register;
   the controller receiving a refresh acknowledge signal from an external system; and
   responsive to receiving the refresh acknowledge signal, the controller directing the page register to read a data state associated with the memory page and rewrite the data state back to the memory.

7. The method as in claim 6, further comprising the controller transmitting a refresh request signal to the external system and awaiting the refresh acknowledge signal.

8. The method as in claim 7, wherein the controller comprises a refresh state machine for coordinating the refresh request and the refresh acknowledge signals.

9. The method as in claim 8, wherein the refresh request signal is triggered by at least one of a threshold drift detector, a power-on reset detector, and a refresh counter.

10. The method as in claim 7, further comprising the controller transmitting a refresh busy signal to the external system when the page register reads and rewrites the data state.

11. The method as in claim 6, further comprising the controller using a page counter to refresh each memory page within the memory.

12. The method as in claim 6, wherein the page register comprises a plurality of latches.

13. The method as in claim 12, wherein the read of the data state further comprises using the plurality of latches to temporarily store the data state.

14. The method as in claim 13, wherein the rewrite of the data state further comprises using the plurality of latches to write the temporarily stored data state back to the memory page.

15. A refreshable non-volatile memory, comprising:
   at least one memory page that includes a plurality of non-volatile memory cells;

a decoder for selecting a memory page from the memory that is to be refreshed;

a page register that includes a plurality of latches for coupling to a selected memory page; and a controller coupled to the page register and configured to receive a refresh acknowledge signal from an external system, wherein, in operation and upon receiving the refresh acknowledge signal, the controller directs the page register to read a data state associated with the selected memory page and rewrite the data state back to the selected memory page.

16. The memory as in claim 15, wherein the controller comprises a refresh state machine for transmitting a refresh request signal to the external system.

17. The memory as in claim 16, wherein the refresh state machine is configured to await the refresh acknowledge signal before reading and rewriting the data state back to the selected memory page.

18. The memory as in claim 16, further comprising a threshold drift detector, a power-on reset detector, and a refresh counter for triggering the refresh state machine to transmit the refresh request signal.

19. The memory as in claim 16, wherein the refresh state machine is configured to output a refresh busy signal to the external system when the memory page is being read and rewritten.

20. The memory as in claim 15, wherein the first plurality of memory cells comprise a plurality of electrically erasable programmable read only memory cells.

* * * * *